(12) United States Patent
Park (10) Patent No.: US 12,308,156 B2
(45) Date of Patent: May 20, 2025

(54) TRANSFORMER INCORPORATING PRINTED CIRCUIT BOARD AND MANUFACTURING METHOD THEREOF

(71) Applicants: Hyundai Motor Company, Seoul (KR); Kia Motors Corporation, Seoul (KR)

(72) Inventor: Jun Hwan Park, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 735 days.

(21) Appl. No.: 16/188,724

(22) Filed: Nov. 13, 2018

(65) Prior Publication Data

US 2019/0355505 A1   Nov. 21, 2019

(30) Foreign Application Priority Data

May 17, 2018  (KR) .......................... 10-2018-0056719

(51) Int. Cl.
| | |
|---|---|
| H05K 1/02 | (2006.01) |
| H01F 27/24 | (2006.01) |
| H01F 27/28 | (2006.01) |
| H01F 27/30 | (2006.01) |
| H01F 41/04 | (2006.01) |
| H05K 1/16 | (2006.01) |

(52) U.S. Cl.
CPC ......... H01F 27/2804 (2013.01); H01F 27/24 (2013.01); H01F 27/306 (2013.01); H05K 1/028 (2013.01); *H01F 2027/2819* (2013.01); *H01F 41/041* (2013.01); *H05K 1/165* (2013.01); *H05K 2201/055* (2013.01); *H05K 2201/056* (2013.01)

(58) Field of Classification Search
CPC ................ H01F 27/2804; H01F 27/24; H01F 2027/2819; H01F 41/041; H05K 2201/055; H05K 2201/056; H05K 1/028
USPC ............................................ 29/602.1, 592.1
See application file for complete search history.

(56) References Cited

U.S. PATENT DOCUMENTS 4,342,976 A * 8/1982 Ryser ...................... H01F 19/08
                                                        336/200
4,975,671 A * 12/1990 Dirks .................. H01F 17/0033
                                                        336/200

(Continued)

FOREIGN PATENT DOCUMENTS

| CN | 1429392 A | 7/2003 |
|---|---|---|
| CN | 204242777 U | 4/2015 |

(Continued)

OTHER PUBLICATIONS

Office Action issued Jan. 1, 2023 in Korean Application No. 10-2018-0056719.

(Continued)

*Primary Examiner* — Livius R. Cazan
(74) *Attorney, Agent, or Firm* — Fox Rothschild LLP (57) ABSTRACT

A transformer includes a core portion having a magnetic property and having a through hole formed therein, and a first coil portion formed with a first circuit board on which circuit patterns are printed on one surface thereof, having a shape enclosing a part of the core portion while penetrating the through hole of the core portion, and formed to be bent so that both side end portions of the first circuit board are connected to each other.

3 Claims, 6 Drawing Sheets

(56) References Cited

U.S. PATENT DOCUMENTS

| | | | |
|---|---|---|---|
| 6,188,305 B1 | 2/2001 | Chang | |
| 6,573,820 B2 * | 6/2003 | Yamada | H01F 27/2804 |
| | | | 336/200 |
| 9,190,204 B1 | 11/2015 | Cates, Jr. | |
| 2001/0043135 A1 | 11/2001 | Yamada et al. | |
| 2011/0285492 A1 * | 11/2011 | Wang | H01F 27/306 |
| | | | 336/198 |
| 2013/0148312 A1 | 6/2013 | Han et al. | |
| 2015/0332836 A1 * | 11/2015 | Lee | H01F 19/00 |
| | | | 29/605 |
| 2015/0340151 A1 * | 11/2015 | Yosui | H05K 1/165 |
| | | | 336/200 |

FOREIGN PATENT DOCUMENTS

| | | | |
|---|---|---|---|
| CN | 105097229 A | | 11/2015 |
| CN | 206432114 U | | 8/2017 |
| DE | 102011119842 A | * | 6/2013 |
| JP | H 04-349604 A | | 12/1992 |
| JP | H 08-51023 A | | 2/1996 |
| JP | 2011-192710 A | | 9/2011 |
| JP | 6170568 A1 | | 7/2017 |
| JP | 2018046142 A | * | 3/2018 |
| KR | 20010114120 A | | 12/2001 |
| KR | 2002-043138 A | | 2/2002 |
| KR | 101251843 B1 | | 4/2013 |
| KR | 10-2013-0071140 A | | 6/2013 |
| KR | 2013071140 A | * | 6/2013 |
| KR | 20130071140 A | * | 6/2013 |
| KR | 101475437 B1 | | 12/2014 |
| KR | 101664092 B1 | | 10/2016 |
| KR | 2018-046142 A | | 3/2018 |

OTHER PUBLICATIONS

Office Action issued on Jan. 8, 2024 in corresponding Chinese Patent Application No. 201811471245.7.

* cited by examiner

FIG. 5

TRANSFORMER INCORPORATING PRINTED CIRCUIT BOARD AND MANUFACTURING METHOD THEREOF

CROSS REFERENCE TO RELATED APPLICATION

The present application claims under 35 U.S.C. § 119(a) the benefit of Korean Patent Application No. 10-2018-0056719 filed on May 17, 2018, the entire contents of which are incorporated by reference herein.

BACKGROUND

(a) Technical Field

The present disclosure relates to a transformer incorporating a printed circuit board and a manufacturing method thereof, more particularly, to a three-dimensional transformer formed by bending a planar printed circuit board.

(b) Description of the Related Art

A transformer is a device used to further increase or decrease AC voltage based on an electromagnetic induction principle. Two primary and secondary coils are wound around a core, and a change in magnetic flux due to the AC current occurs when the AC voltage is applied to the primary coil, which induces an inductive electromotive force in the secondary coil again. The magnitude of the electromotive force induced in the secondary coil and the number of coil turns have the following relationship.

$$V2/V1=N2/N1$$

Herein, V1 refers to the supply voltage of the primary coil, V2 to the inductive electromotive power of the secondary coil, N1 to the number of primary coil turns, and N2 to the number of secondary coil turns.

Accordingly, when it is desired to increase the voltage, the number of secondary coil turns can be set to be greater than the number of primary coil turns. Herein, since energy is conserved when heat loss is ignored, the power input to the primary coil is equal to the power output to the secondary coil.

In such a transformer, the primary and secondary coils enclose a part of the core, and in order to form the primary coil and the secondary coil, it is necessary to wind coil around the core. However, there has been a problem in that the winding work requires an expensive winding device and a skillful technique, and it takes much effort and time for the work. In addition, the volume due to the end turns of the coil turns is expanded, and various problems such as a short, an edge, or vibration caused in the coil turns have occurred.

To solve the problems, a transformer using a Printed Circuit Board (PCB) has been developed, but a planar transformer using such a printed circuit board has a problem that a sufficient transformer capacity cannot be obtained.

The foregoing is intended merely to aid in the understanding of the background of the present disclosure, and is not intended to mean that the present disclosure falls within the purview of the related art that is already known to those skilled in the art.

SUMMARY

The present disclosure provides a three-dimensional transformer and a method of manufacturing the transformer, which is formed to bend a planar printed circuit board on which a circuit pattern is printed to enclose a core.

A transformer in accordance with the present disclosure includes a core portion having a magnetic property and having a through hole formed therein; and a first coil portion formed with a first circuit board on which circuit patterns are printed on one surface thereof, having a shape enclosing a part of the core portion while penetrating the through hole of the core portion, and formed to be bent so that side end portions (i.e., both side end portions) of the first circuit board are connected to each other.

The first coil portion can be connected to the side end portions of the first circuit board so that the printed circuit patterns of the first circuit board are continuous.

The transformer can further include a connector coupled to the side end portions of the first circuit board by soldering, respectively, to connect the circuit patterns printed on the first circuit board.

The first coil portion can include a second circuit board connected between the side end portions of the first circuit board so that the circuit patterns printed on one surface thereof are continuous with the circuit patterns of the first circuit board.

The first coil portion can include a connector provided between the side end portions of the first circuit board and the second circuit board to connect the circuit patterns printed on the second circuit board with the circuit patterns printed on the first circuit board.

The connector can be coupled with the first circuit board or the second circuit board by soldering.

The first coil portion can have a cutting line in which a part of the first circuit board is cut formed on an other surface of the first circuit board, and the first circuit board can be bent along the formed cutting line.

The first coil portion can be bent so that the other surface of the first circuit board on which the cutting line is formed forms the outside surface thereof and one surface of the first circuit board on which the circuit patterns are printed can be located on the inside surface thereof.

The first coil portion can be bent so that the other surface of the first circuit board on which the cutting line is formed forms the inside surface thereof and one surface of the first circuit board on which the circuit pattern is printed can be located on the outside surface thereof.

The transformer can further include a second coil portion formed with the first circuit board on which a circuit pattern is printed on one surface thereof, having the shape enclosing another part of the core portion while penetrating the through hole of the core portion, and formed to be bent so that the side end portions of the first circuit board are connected to each other; and the number of the circuit patterns printed on the first circuit board forming the first coil portion and the second coil portion, respectively, can be different from each other.

The transformer can further include a second coil portion formed with the first circuit board on which a circuit pattern is printed on one surface thereof, having the shape enclosing another part of the core portion while penetrating the through hole of the core portion, and formed to be bent so that the side end portions of the first circuit board are connected to each other; and the first coil portion and the second coil portion can be formed by stacking at least one of the first circuit boards, and the number of the first circuit boards forming the first coil portion and the second coil portion, respectively, can be different from each other.

A method of manufacturing a transformer in accordance with the present disclosure includes printing a circuit pattern on one surface of a first circuit board; bending the first circuit board in a shape enclosing a part of a core portion while the first circuit board penetrates a through hole of the core portion having a magnetic property; and forming a first coil portion by connecting side end portions of the first circuit board to each other.

The method can further include forming a cutting line cutting a part of the first circuit board on the other surface of the first circuit board before the bending, and in the bending, the first circuit board can be bent along the cutting line.

The forming the first coil portion can connect the side end portions of the first circuit board so that the circuit patterns printed on the first circuit board are continuous.

The forming the first coil portion can connect the second circuit board on which the circuit patterns are printed between the side end portions of the first circuit board to be continuous with the circuit patterns printed on the first circuit board.

The method can further include connecting with the circuit patterns printed on the first circuit pattern by coupling a connector to the side end portions of the first circuit board by soldering before the bending.

According to the transformer using the printed circuit board and the manufacturing method thereof in accordance with the present disclosure, there are the effects in that a winding device and a skillful technology are unnecessary because the winding coil of the transformer is replaced with the PCB pattern, and the time required for production is reduced, thus enhancing the productivity of the transformer.

In addition, there is the effect in that the problems such as shorts and edges of the coil caused in the coil winding process are solved.

In addition, there is the effect in that the space occupied by the end turns of the wound coil is eliminated, thus reducing the volume of the transformer.

In addition, there is the effect in that the transformer capacity can be increased compared to the transformer using the conventional planar PCB.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION OF THE DISCLOSURE

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-of", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Various modifications and various forms can be made in the embodiments in accordance with the present disclosure, so that specific embodiments are illustrated in the drawings and described in detail in the specification or application. It should be understood, however, that it is not intended to limit the embodiments in accordance with the concepts of the present disclosure to the particular disclosed forms, but includes all modifications, equivalents, and alternatives falling within the sprit and technical scope of the present disclosure.

The terms "first" and/or "second," and the like are used to illustrate various components, but the components should not be limited by the terms. The terms are used to differentiate one element from another, for example, a first component can be referred to as a second component, and similarly, the second component can be also referral to as the first component without departing from claims in accordance with the concepts of the present disclosure.

It will be understood that when an element is referred to as being "connected" or "coupled" to another element, it can be "directly connected" or "coupled" to the other element, but also to the other element with other elements interposed therebetween. On the other hand, it should be understood that any configuration element has no other element in between the time stated that "directly connected" or "directly coupled" to another element. Other expressions that describe the relationship between elements, such as "between" and "directly between" or "adjacent to" and "directly adjacent to" should be interpreted as well.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be additionally interpreted as having a meaning that is consistent with their meaning in the context of the relevant art, and will not be interpreted in an idealized or overly formal sense unless expressly so defined in the specification.

Hereinafter, preferred embodiments of the present disclosure will be described in detail with reference to the accompanying drawings. The same reference numerals denoted in each drawing denote the same members.

Figure 1:
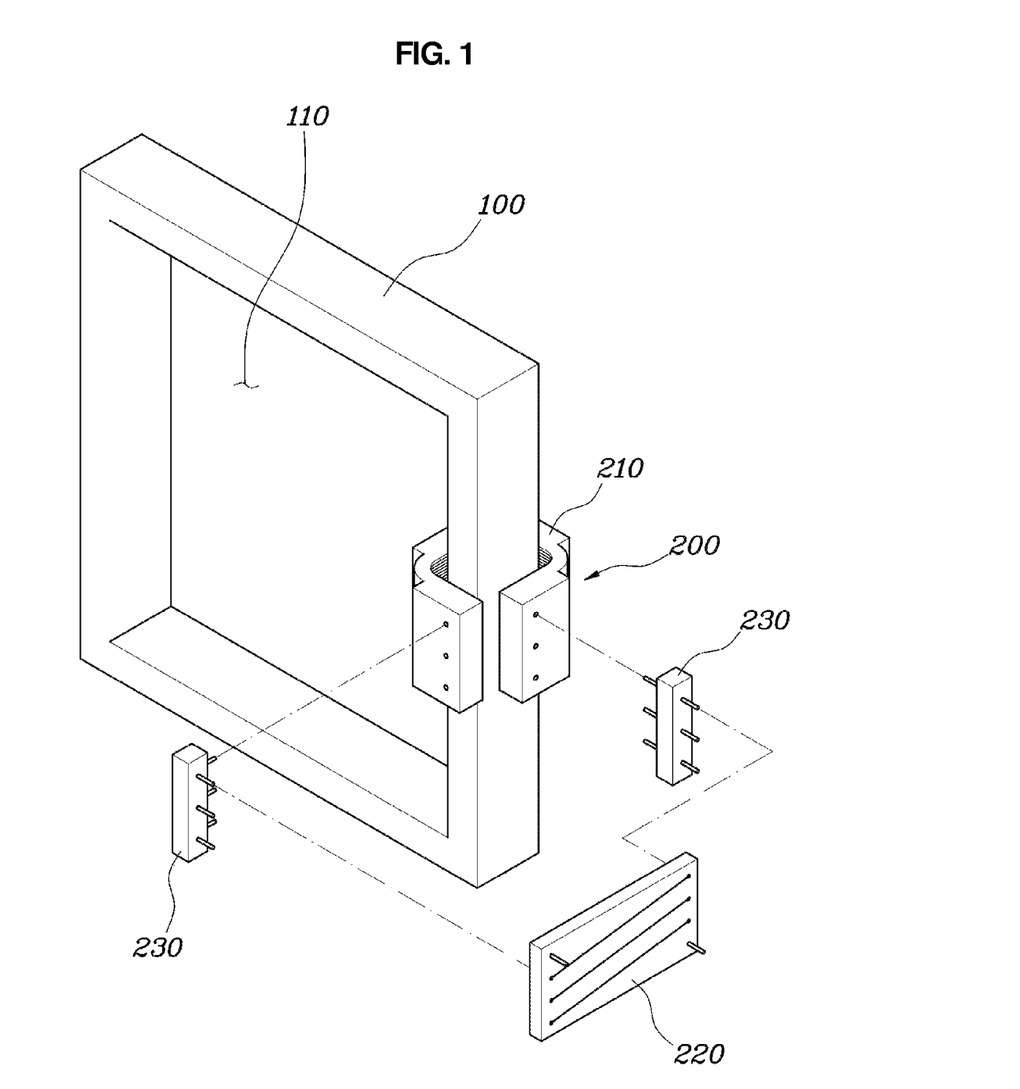
FIG. 1 is an exploded perspective view of a transformer in accordance with an embodiment of the present disclosure.
Figure 2:
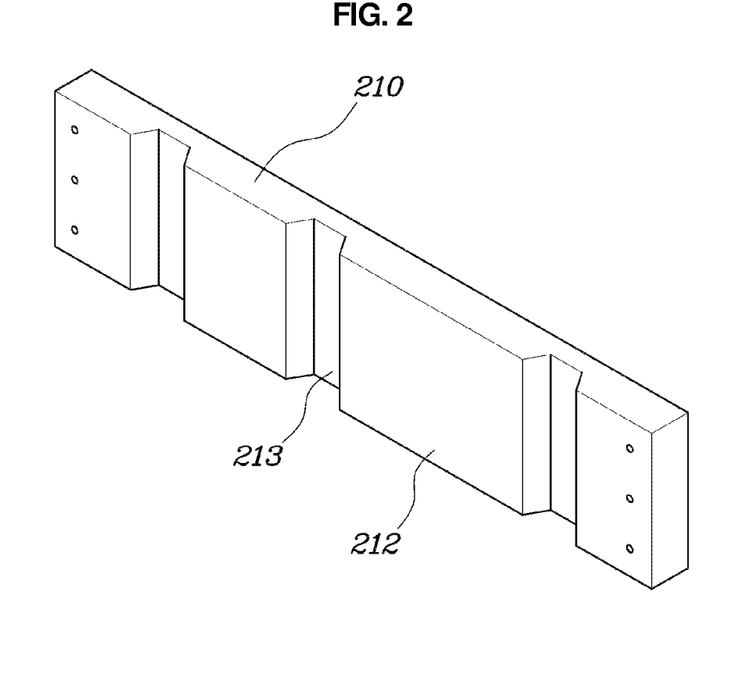
FIG. 2 is a perspective view illustrating the state before a first circuit board forming a first coil portion in accordance with an embodiment of the present disclosure is bent.

FIG. 1 is an exploded perspective view of a transformer in accordance with an embodiment of the present disclosure, and FIG. 2 is a perspective view illustrating the state before a first circuit board 210 in accordance with an embodiment of the present disclosure is bent. As provided herein, a transformer incorporates a printed circuit board, which corresponds to a first circuit board and/or a second circuit board as described herein.

Referring to FIGS. 1 and 2, a transformer in accordance with an embodiment of the present disclosure includes a core portion 100 having a magnetic property and having a through hole 110 formed therein; and a first coil portion 200 formed with a first circuit board 210 on which a circuit pattern is printed on one surface thereof, having the shape enclosing a part of the core portion 100 while penetrating the through hole of the core portion 100, and formed to be bent so that side end portions (i.e., both side end portions) of the first circuit board are connected to each other.

The transformer is used to increase or decrease the AC voltage using the electromagnetic induction phenomenon. Accordingly, the first coil portion 200 is formed to enclose a part of the core portion 100. Generally, the transformer includes a primary coil and a secondary coil connected to an input side to which power is input and an output side to which power is output, respectively. However, since only the number of coil turns is different between the primary coil and the secondary coil and the technology of the present disclosure is identically applied to them, only the first coil portion 200 will be described in detail, and this can be identically applied to both the primary coil and the secondary coil and can be identically applied to the second coil portion 300 as well.

The core portion 100, which is also called an iron core, is a passage of the magnetic force line for forming a magnetic circuit. Accordingly, the core portion 100 is formed of a magnetic material, and in a high frequency circuit, a dust core that is compression-molded with an electrically insulating coating using a magnetic material as a powder can be used.

The core portion 100 can be various shapes, but in this embodiment, it is a rectangular parallelepiped shape and has a through hole 110 formed therein, and is explained as the shape enclosing a part of the core portion 100 while the first coil portion 200 penetrates the through hole 110 of the core portion 100.

The first coil portion 200 is formed with the first circuit board 210 on which a circuit pattern is printed on one surface 211 thereof. A plurality of circuit patterns can be printed on one surface 211 of the first circuit board 210. Particularly, the circuit pattern can be a straight-line shaped circuit pattern extending from one side end portion thereof to the other side end portion thereof.

The first coil portion 200 can be the shape enclosing a part of the core portion 100 while penetrating the though hole 110 of the core portion 100 and formed to be bent so that both side end portions of the first circuit board 210 are connected to each other. As shown in FIG. 1, for example, when a part of the core portion 100 is the square pillar shape, the first circuit board 210 is bent by three times to form the first coil portion 200 in order to enclose a part of the core portion 100. A bent angle can be 90° as illustrated, but can be also formed at an acute angle of 90° or less, or an obtuse angle of 90° or more, such that the number of bent times can be changed.

Accordingly, a winding device and a skillful technique are unnecessary as the winding coil of the transformer is replaced with a PCB pattern, and the time required for production is reduced, thus enhancing the production of the transformer.

The first coil portion 200 can have both side end portions of the first circuit board 210 connected to each other so that the printed circuit patterns of the first circuit board 210 are continuous. That is, both side end portions of the first circuit board 210 can be connected so that the circuit patterns having the straight-line shape between the both side end portions of the first circuit board 210 are connected to each other to form the coil on which the printed circuit patterns of the first circuit board 210 are continuous.

As one embodiment, both side end portions of the first circuit board 210 can be directly coupled to each other. That is, one side end portion of the first circuit board 210 and the other side end portion thereof can be coupled through soldering, such that the circuit patterns of the first circuit board 210 can be continuous.

As another embodiment, the present disclosure can further include a connector 230 that is coupled to both side end portions of the first circuit board 210, respectively, by soldering to connect the circuit patterns printed on the first circuit board 210.

As a further embodiment, the first coil portion 200 can include a second circuit board 220 that is connected between both side end portions of the first circuit board 210 so that the circuit patterns printed on one surface thereof are continuous with the circuit patterns of the first circuit board 210. That is, the second circuit board 220 on which the circuit patterns are printed on one surface 211 thereof like the first circuit board 210 is further provided, such that the second circuit board 220 is coupled to both side end portions of the first circuit board 210, respectively to continuously connect the circuit patterns of the first circuit board 210. In addition, the second circuit board 220 can be also used by a planar circuit board as it is, and can be coupled with the first circuit board 210 in the bent state like the first circuit board 210.

The first coil portion 200 can include the connector 230 that is provided between both side end portions of the first circuit board 210 and the second circuit board 220 to connect the circuit patterns printed on the second circuit board 220 with the circuit patterns printed on the first circuit board 210.

The connector 230 has one end connected to the circuit patterns of the first circuit board 210 at both side end portions of the first circuit board 210, and has the other end coupled with the first circuit board 210 or the second circuit board 220 by soldering to be connected to the circuit patterns of the second circuit board 220. In addition, the connector 230 can directly connect between both side end portions of the first circuit board 210 without the second circuit board 220 as well.

Figure 3:
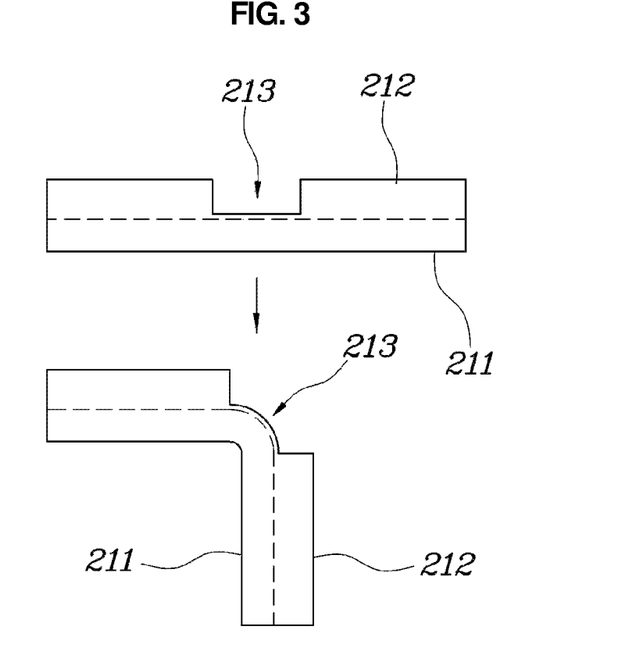
FIGS. 3 and 4 illustrate a cutting line and a bent direction in accordance with an embodiment of the present disclosure.
Figure 4:
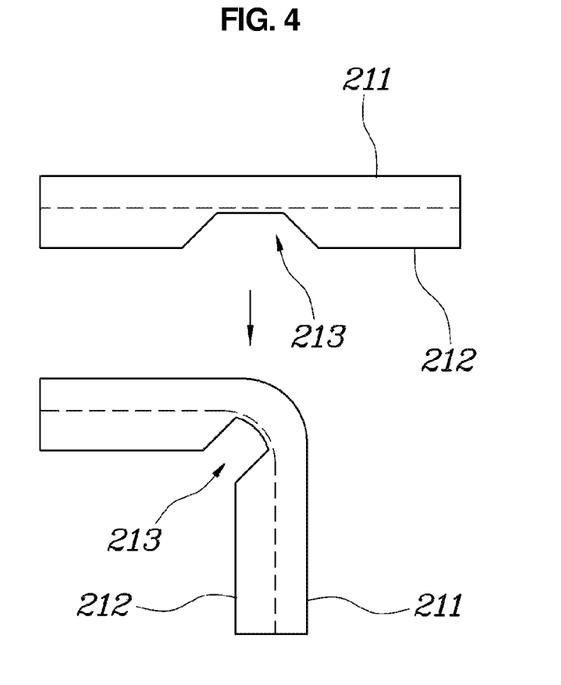

FIGS. 3 and 4 illustrate a cutting line 213 and a bent direction in accordance with an embodiment of the present disclosure.

Further referring to FIGS. 3 to 4, the first coil portion 200 has the cutting line 213 on which a part of the first circuit board 210 is cut formed on the other surface of the first circuit board 210, and the first circuit board 210 can be bent along the formed cutting line 213.

The cutting line 213 on which a part of the first circuit board 210 is cut can be formed on the other surface, which is opposite to one surface of the first circuit board 210 on which the circuit patterns are printed, by a cutting process such as a milling. The first circuit board 210 can be bent along the formed cutting line 213.

As illustrated in FIG. 3, the first coil portion 200 can be bent so that the other surface 212 of the first circuit board 210 on which the cutting line 213 is formed forms the outside surface thereof. That is, the other surface 212 of the first circuit board 210 on which the cutting line 213 is formed forms the outside surface thereof, such that one surface 211 of the first circuit board 210 on which the circuit pattern is printed can be located on the inside surface thereof.

On the contrary, as illustrated in FIG. 4, the first coil portion 200 can be bent so that the other surface 212 of the first circuit board 210 on which the cutting line 213 is formed forms the inside surface thereof, such that one surface 211 of the first circuit board 210 on which the circuit patterns are printed can be located on the outside surface thereof.

That is, the cutting line 213 is formed on the other surface 212 that is opposite to the one surface 211 of the first circuit board 210 on which the circuit patterns are printed, and the other surface 212 on which the cutting line 213 is formed is bent to become the outside surface of the first coil portion 200, or conversely, the other surface 212 on which the cutting line 213 is formed is bent to become the inside surface of the first coil portion 200. The cutting line 213 can be processed so that the shape of the cutting line 213 is different from each other along the bent direction.

The transformer using the printed circuit board in accordance with the embodiment of the present disclosure can further include a second coil portion 300 formed with the first circuit board 210 on which the circuit patterns are printed on one surface 211 thereof, having the shape enclosing another part of the core portion 100 while penetrating the through hole 110 of the core portion 100, and formed to be bent so that both side end portions of the first circuit board 210 are connected to each other. The first coil portion 200 and the second coil portion 300 can be connected to a power input side of the transformer or a power output side thereof, respectively.

The number of circuit patterns printed on the first circuit board 210 forming the first coil portion 200 and the second coil portion 300, respectively, can be different from each other. Accordingly, as the number of the coil turns of the first coil portion 200 and the number of the coil turns of the second coil portion 300 are different, the voltage at the power input side and the voltage at the power output side are different to thereby perform the transformation.

Figure 5:
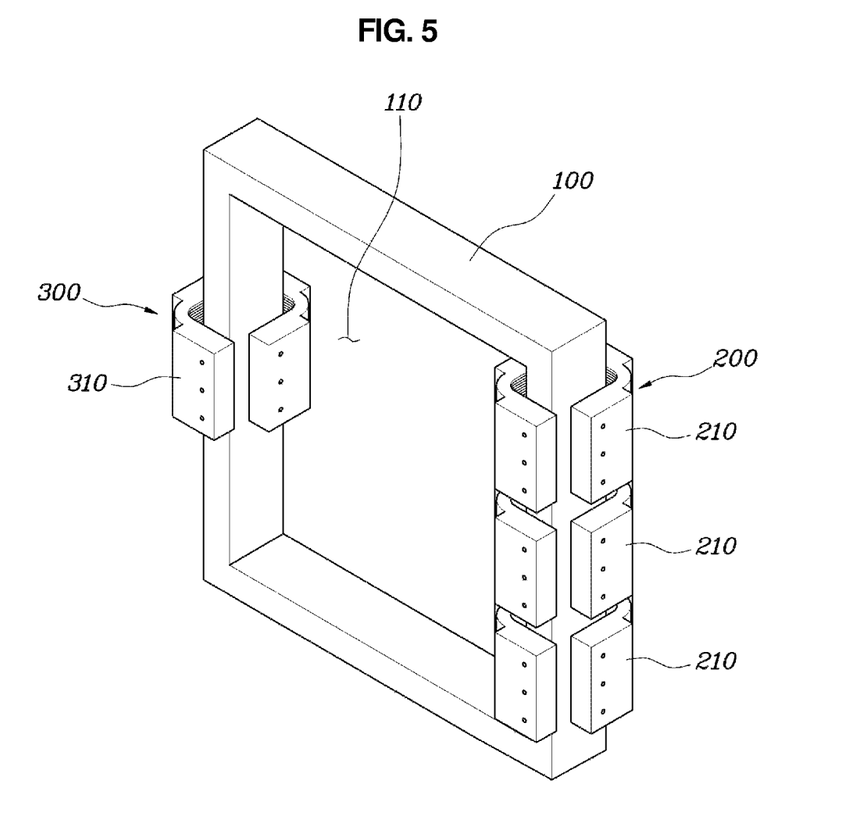
FIG. 5 is a perspective view of a transformer in accordance with another embodiment of the present disclosure.

FIG. 5 is a perspective view of a transformer in accordance with another embodiment of the present disclosure.

Referring to FIG. 5, the transformer using the printed circuit board can further include the second coil portion 300 formed with the first circuit board 210 on which the circuit patterns are printed on one surface 211 thereof, having the shape enclosing another part of the core portion 100 while penetrating the through hole 110 of the core portion 100, and formed to be bent so that both side end portions of the first circuit board 210 are connected to each other; the first coil portion 200 and the second coil portion 300 are formed by stacking at least one of the first circuit boards 210, 310; and the number of the first circuit boards 210, 310 forming the first coil portion 200 and the second coil portion 300, respectively, can be different from each other.

That is, the first coil portion 200 and the second coil portion 300 connected to the power input side of the transformer or the power output side thereof can be formed by stacking at least one of the same first circuit portions 210, 310. However, the number of the first circuit boards 210, 310 forming the first coil portion 200 and the second coil portion 300 can be different. Accordingly, the numbers of coil turns of the first coil portion 200 and the second coil portion 300 are different, such that the transformer can increase or decrease the voltage between the power input side and the power output side. That is, it is possible to form the first coil portion 200 and the second coil portion 300 using the same first circuit boards 210, 310 so that the numbers of coil turns of the first coil portion 200 and the second coil portion 300 become different, thus enhancing the productivity.

In addition, the increase or decrease ratio of the transformer can be easily changed by additionally assembling or disassembling the first circuit boards 210, 310.

According to the embodiment of FIG. 5, since the ratio of the number of the coil turns is 1:3, a transformer that can increases a voltage by three times or drops it by ⅓ can be formed.

Figure 6:
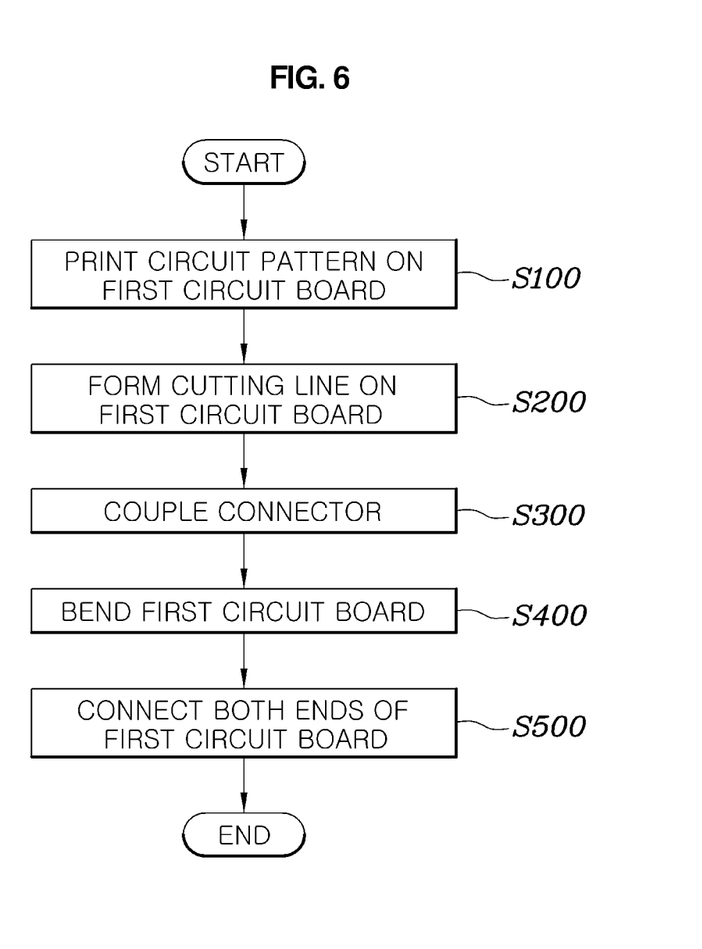
FIG. 6 is a flowchart of a method of manufacturing a transformer in accordance with an embodiment of the present disclosure.

FIG. 6 is a flowchart of a method of manufacturing a transformer in accordance with an embodiment of the present disclosure.

Referring to FIG. 6, a method of manufacturing a transformer in accordance with an embodiment of the present disclosure includes printing a circuit pattern on one surface of a first circuit board (S100); bending the first circuit board in the shape enclosing a part of the core portion while the first circuit board penetrates a through hole of the core portion having a magnetic property (S400); and forming a first coil portion by connecting both side end portions of the first circuit board to each other (S500).

Before the bending step (S400), the method can further include forming a cutting line cutting a part of the first circuit board on the other surface of the first circuit board (S200), and in the bending (S400), the first circuit board can be bent along the cutting line.

In forming the first coil portion (S500), both side end portions of the first circuit board can be connected so that the printed circuit patterns of the first circuit board are continuous. In this time, both side end portions of the first circuit board can be coupled to be directly connected to each other.

In addition, in forming the first coil portion (S500), a second circuit board on which the circuit patterns are printed can be connected between both side end portions of the first circuit board in order to be continuous with the circuit patterns printed on the first circuit pattern. That is, the second circuit board can be provided between both side end portions of the first circuit board to connect both side end portions of the first circuit board to the second circuit board, respectively.

Before the bending step (S400), the method can further include connecting a connector to both side end portions of the first circuit board by soldering to be connected with the circuit patterns printed on the first circuit board.

The connector can be also coupled to the first circuit board while bending the first circuit board, but can be coupled to the first circuit board before being bent. The soldering operation can be more convenient as it is coupled to the planar first circuit board that is not bent by soldering A bent angle of the first circuit board in the bent state can be flexibly changed on the bent portion to cause a gap therebetween, such that it can be detrimental to the soldering operation.

Hereinafter, the same description as the transformer using the printed circuit board will be omitted.

Although the present disclosure has been illustrated and described in connection with the specific embodiments, those skilled in the art will appreciate that the present disclosure can be variously modified and changed without departing from the technical spirit of the present disclosure as disclosed in the accompanying claims.

What is claimed is:

1. A method of manufacturing a transformer, comprising:
   printing circuit patterns on one surface of a first circuit board and a second circuit board;
   bending the first circuit board in a shape enclosing a part of a core portion while the first circuit board penetrates a through hole of the core portion having a magnetic property;
   forming a first coil portion by connecting side end portions of the first circuit board to each other;
   forming a cutting portion as a part of the first circuit board on another surface of the first circuit board is cut before bending the first circuit board; and
   providing a connector including a body and at least one electrically conductive member, wherein the body has an external surface including at least three side surfaces positioned outside of the first circuit board and the second circuit board, and wherein the at least one electrically conductive member extends through the body;
   wherein a first end of the at least one electrically conductive member protrudes from a first side surface of the at least three side surfaces and is electrically connected to the circuit patterns on the external surface of the first circuit board, and wherein a second end of the at least one electrically conductive member protrudes from a second side surface of the at least three side surfaces, ipposite the first side surface, is electrically connected the circuit patterns on the external surface of the second circuit board such that the circuit patterns of the first circuit board are continuously connected to the circuit patterns of the second circuit board.

2. The method of manufacturing the transformer according to claim 1,
   wherein in bending the first circuit board, the first circuit board is bent along the cutting portion.

3. The method of manufacturing the transformer according to claim 1,
   wherein forming the first coil portion connects the side end portions of the first circuit board so that the printed circuit patterns of the first circuit board are continuous.

* * * * *